US006005501A

United States Patent [19]

Wolosewicz

[11] Patent Number: 6,005,501

[45] Date of Patent: Dec. 21, 1999

[54] APPARATUS AND METHOD FOR ENCODING AND DECODING INFORMATION IN AUDIO SIGNALS

[75] Inventor: Jack Wolosewicz, Cambridge, Mass.

[73] Assignee: Aris Technologies, Inc., Cambridge, Mass.

[21] Appl. No.: 09/083,940

[22] Filed: May 26, 1998

Related U.S. Application Data

[62] Division of application No. 08/404,278, Mar. 14, 1995, Pat. No. 5,774,452.

[51] Int. Cl.[6] .......... H03M 7/00

[52] U.S. Cl. .......... 341/52

[58] Field of Search .......... 341/52; 340/825.35, 340/825.03; 348/3, 10; 379/91.02, 101.01; 380/10

[56] References Cited

U.S. PATENT DOCUMENTS 4,669,089 5/1987 Gahagan et al. .......... 375/200
4,789,863 12/1988 Bush .......... 340/825.35
5,161,251 11/1992 Mankovitz .......... 455/154.1
5,214,792 5/1993 Alwadish .......... 455/154.1
5,319,735 6/1994 Preuss et al. .......... 395/2.14
5,379,345 1/1995 Greenberg .......... 380/23
5,404,377 4/1995 Moses .......... 375/200
5,497,372 3/1996 Nankoh et al. .......... 455/154.1

*Primary Examiner*—Brian Young
*Attorney, Agent, or Firm*—Rothwell, Figg, Ernst & Kurz

[57] ABSTRACT

A method and apparatus encodes and decodes machine readable signals in audio signals for producing humanly perceived audio transmissions. The encoding device includes circuitry for identifying portions of the audio signal having relatively low energy in a given band and relatively high energy in a band proximally below the given band. The machine readable signals are then inserted into the identified portions of the audio signal. According to another embodiment, the machine readable signals are encoded as a spread-spectrum signal which is added to the original audio signal. The spread-spectrum signal is scaled using a unique technique referred to as Common Mode Scaling.

20 Claims, 11 Drawing Sheets

FIG.16
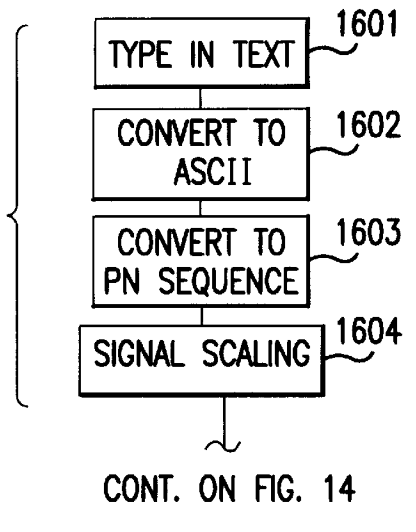
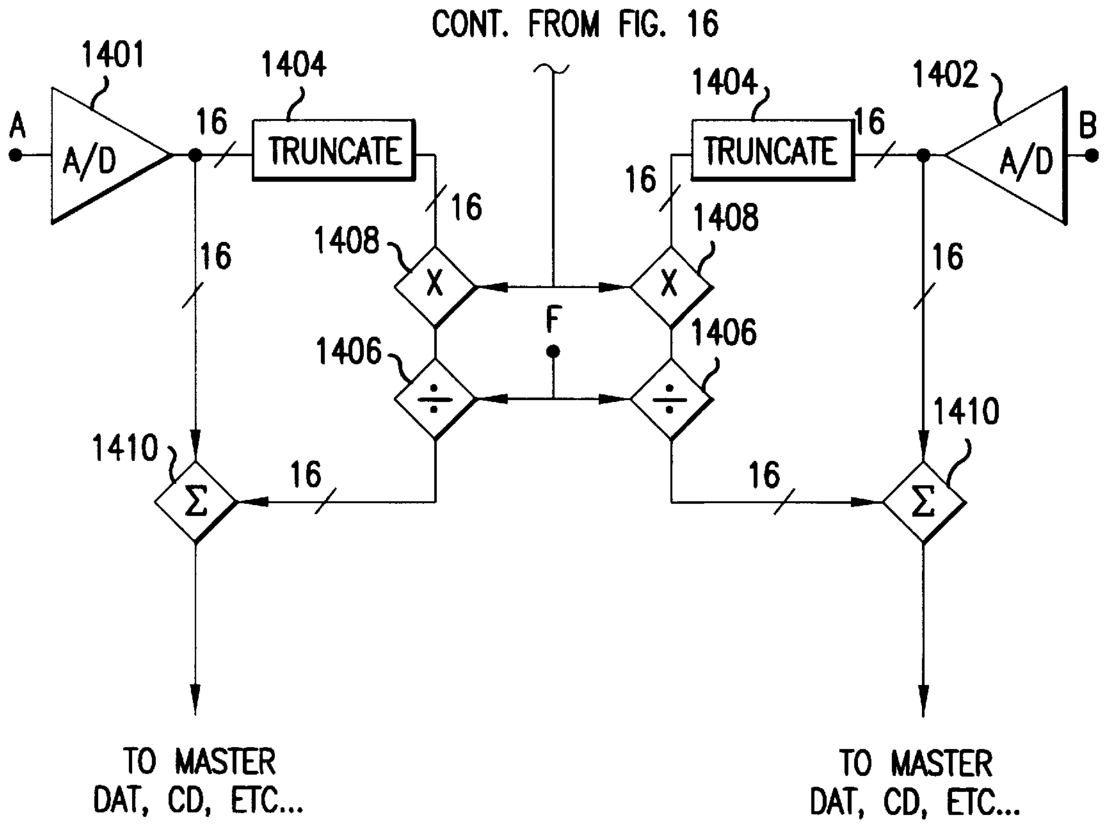
FIG.14

APPARATUS AND METHOD FOR ENCODING AND DECODING INFORMATION IN AUDIO SIGNALS

This application is a division of 08/404,278, filed Mar. 14, 1995, now U.S. Pat. No. 5,774,452.

BACKGROUND OF THE INVENTION

1. Field of the Invention

This invention relates to apparatus and method for encoding and decoding information in audio signals, such as those commonly recorded on records, tapes, and compact discs.

2. Description of Related Art

Audio codes have been used for centuries. Audio codes include the use of jungle drums to communicate information. Defined broadly, audio codes even include human speech. In the modern age audio codes have included the transmission of morse code, in the form of tones of varying length, over the airwaves. Such codes function well when conveying information to humans and have served useful functions.

In this modern age in which electronics are making it possible for machines to perform an ever increasing number of functions, it is desirable to combine machine readable codes with an audio signal designed for human listening. For example, audio cue tones have been placed on audio tapes to help a tape player advance to and stop at the location at which the tone occurs. The problem with such tones is that their presence can interfere with the enjoyment of listening to audio signals by human listeners, and they do not carry very much information.

It is also known to pulse-width modulate a signal to provide a common or encoded signal carrying at least two information portions or other useful portions. In U.S. Pat. No. 4,497,060 to Yang (1985) binary data is transmitted as a signal having two differing pulse-widths to represent logical "0" and "1" (e.g., the pulse-width durations for a "1" are twice the duration for a "0"). This correspondence also enables the determination of a clocking signal.

Various techniques for encoding signals are also known. For example, U.S. Pat. No. 4,937,807 to Weitz et al. (1990) discloses a method and apparatus for encoding signals for producing sound transmissions with digital information to enable addressing the stored representation of such signals. Specifically, the apparatus in Weitz et al. converts an analog signal for producing such sound transmissions to clocked digital signals comprising for each channel an audio data stream, a step-size stream and an emphasis stream. The device and method also include editing the encoded digital signals to add other information to enable high volume storage, direct access and higher throughput.

With respect to systems in which audio signals produce audio transmissions, U.S. Pat. No. 4,876,617 to Best et al. (1989) and U.S. Pat. No. 5,113,437 to Best et al. (1992) disclose encoders for forming relatively thin and shallow (e.g., 150 Hz wide and 50 dB deep) notches in mid-range frequencies of an audio signal. The earlier of these patents discloses paired notch filters centered about the 2883 Hz and 3417 Hz frequencies; the later patent discloses notch filters but with randomly varying frequency pairs to discourage erasure or inhibit filtering of the information added to the notches. The encoders then add digital information in the form of signals in the lower frequency indicating a "0" and in the higher frequency a "1". In the later Best et al. patent an encoder samples the audio signal, delays the signal while calculating the signal level, and determines during the delay whether or not to add the data signal and, if so, at what signal level. The later Best et al. patent also notes that the "pseudo-random manner" in moving the notches makes the data signals more difficult to detect audibly.

An area of particular interest to certain embodiments of the present invention relates to the market for musical recordings. Currently, a large number of people listen to musical recordings on radio or television. They often hear a recording which they like enough to purchase, but don't know the name of the song, the artist performing it, or the record, tape, or CD album of which it is part. As a result, the number of recordings which people purchase is less than it otherwise would be if there was a simple way for people to identify which of the recordings that they hear on the radio or TV they wish to purchase.

Another area of interest to certain embodiments of the invention is copy control. There is currently a large market for audio software products, such as musical recordings. One of the problems in this market is the ease of copying such products without paying those who produce them. This problem is becoming particularly troublesome with the advent of recording techniques, such as digital audio tape (DAT), which make it possible for copies to be of very high quality. Thus it would be desirable to develop a scheme which would prevent the unauthorized copying of audio recordings, including the unauthorized copying of audio works broadcast over the airwaves.

The prior art fails to provide a method and an apparatus for encoding and decoding analog audio frequency signals for producing humanly perceived audio transmissions with signals that define digital information such that the audio frequency signals produce substantially identical humanly perceived audio transmission prior to and after encoding. The prior art also fails to provide relatively simple apparatus and methods for encoding and decoding audio frequency signals for producing humanly perceived audio transmissions with signals defining digital information. The prior art also fails to disclose a method and apparatus for limiting unauthorized copying of audio frequency signals for producing humanly perceived audio transmissions.

SUMMARY OF THE INVENTION

It is an object of the present invention to provide apparatus and methods for encoding, storing and decoding machine readable codes on an audio signal in a way which has minimal impact on what a person hears when listening to an audio output of that signal.

It is another object of the present invention to provide apparatus and methods for encoding, storing and decoding machine readable signals in an audio signal which control the ability of a device to copy the audio signal.

It is a further object of this invention to provide apparatus and methods for keeping track of the identity of audio recordings which are transmitted over radio or television broadcasts.

According to one aspect of the invention, an encoding device includes a generator for generating a pulse-width-modulated (PWM) digital information signal in a given band of the audio frequency spectrum. A summer adds the digital information signal to selected portions of an audio frequency signal that have been identified as having low energy in the given band and relatively high energy in a band proximally below the given band to produce an encoded audio signal such that the perception of the encoded audio signal is substantially identical to the perception of the original audio signal. The encoding device may further encode digital information in both first and second audio frequency channel signals of a stereo audio frequency signal.

In accordance with another aspect of this invention there is provided an apparatus includes a canceler that cancels a given audio frequency band in portions of a first audio frequency signal and an encoder that encodes digital information in a pulse-width-modulated second signal within the given band. A summer adds the pulse-width-modulated signal to the audio signal in the canceled portions to produce an encoded analog audio frequency signal such that the perception of the encoded audio signal is substantially identical to the original audio frequency signal.

In accordance with yet another aspect of this invention a decoding device decodes an encoded audio frequency signal having a humanly perceptible audio frequency signal and an encoded digital information signal. Sampling circuitry separates the digital information signal from the audio frequency signal, and a decoder decodes the encoded information signal with an asynchronous, high speed clock to extract the encoded information. An output device generates a humanly perceived output corresponding to the extracted digital information. The decoding device can further include a canceler connected to the sampling circuitry for canceling the information signal in the encoded audio signal.

In accordance with still another aspect of this invention a recording device with recording apparatus for recording an audio frequency signal receives an encoded analog audio frequency first signal for producing a humanly perceived audio transmission. The first signal includes, in a given band, encoded, temporally spaced, pulse-width-modulated second signals. A filter separates the second signals from the first signal, and a decoder decodes the second signals with an asynchronous, high speed clocking signal to extract digital information. A disable responsive to the state of the decoded information selectively disables the recording apparatus to inhibit unauthorized copying of the first signal.

According to a further aspect of this invention a method for encoding an analog audio frequency signal includes generating a pulse-width-modulated signal representing digital information in a given band of the audio frequency spectrum. The method also includes identifying portions of the audio frequency signal suited for addition of the encoded information signal and then summing the first and second signals to produce an encoded audio frequency signal with the human perception of the encoded audio signal being substantially identical to the original audio signal.

According to another preferred embodiment of the invention, the digital information is encoded in a spread spectrum signal which is scaled prior to being added to the audio signal using a novel scaling process.

BRIEF DESCRIPTION OF THE DRAWINGS

These and other aspects of the present invention will become more fully understood from the following detailed description of the preferred embodiments in conjunction with the accompanying drawings, in which:

FIG. 14 is a diagram of circuitry for scaling encoding a spread spectrum signal according to the present invention;

FIG. 16 is a flow diagram for generating a spread spectrum information signal according to the present invention.

DESCRIPTION OF THE PREFERRED EMBODIMENTS

Figure 1:
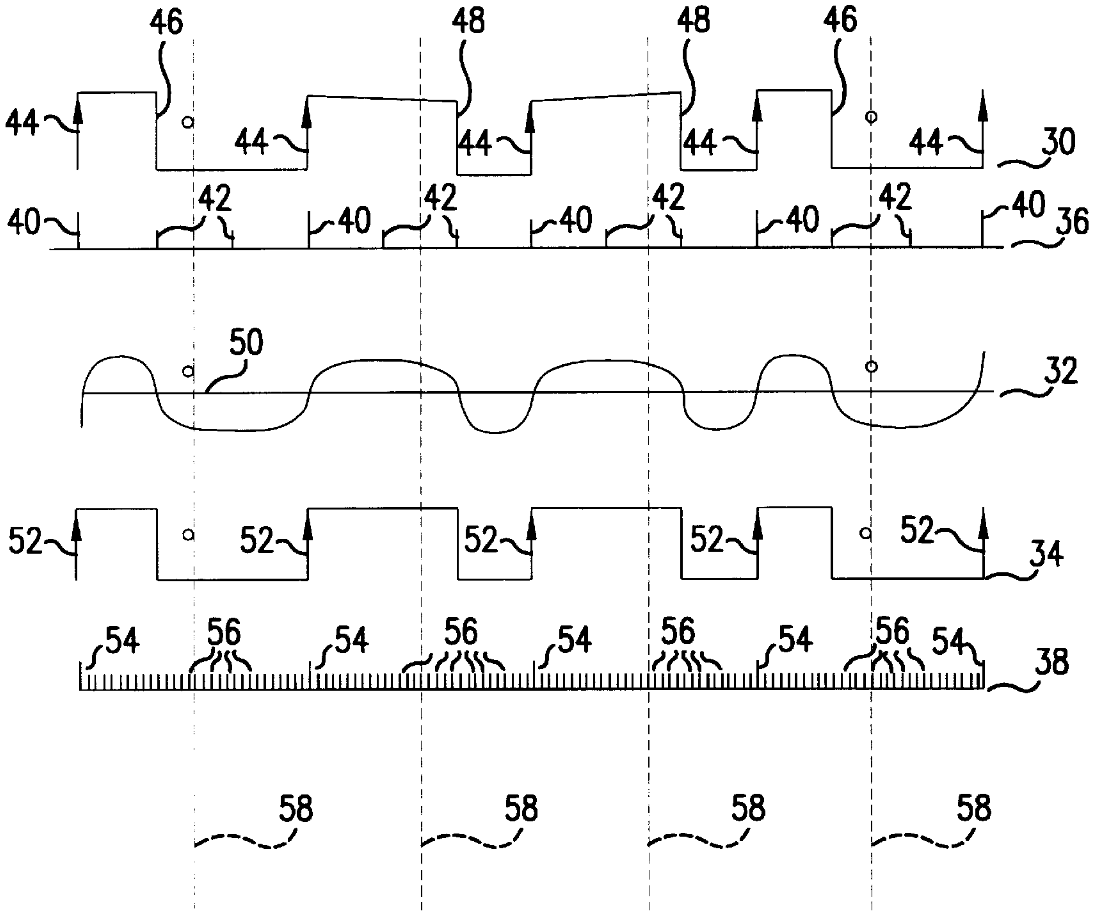
FIG. 1 is a set of waveforms used to explain the pulse code encoding scheme used in one preferred embodiment of the invention.

FIG. 1 displays the pulse code encoding technique which is used with a first preferred embodiment of the present invention. It should be understood, however, that in other embodiments of the invention other encoding techniques such as phase, amplitude or frequency modulation could be used to encode machine readable information in an audio signal. In addition, signals could be encoded in multiple bands by any one or a combination of such techniques.

In the current specification, the phrase "audio frequency" refers to the frequency range in which humans can hear and in which signals are reproduced with reasonable accuracy by hi-fi radio and by hi-fi record, tape, and CD players typically in the range of approximately 50 Hz to 25 kHz. Few humans can hear much if anything at 25 kHz, but much good hi-fi equipment can handle such frequencies. The upper limit on the frequency at which machine readable information can be encoded is the frequency response of the equipment for recording and reproducing the audio signals in which such information is encoded. For the embodiment of the invention which is applicable to the recorded music industry, a limitation will be the highest frequency at which the signals broadcast by and received from commercial radio stations can faithfully reproduce audio signals. This upper frequency limit can vary from station to station, country to country, and from year to year as technology changes. In the first preferred embodiment of the invention described below data bits are transmitted at 10 Kbits/second. It should be understood, however, that if the particular 10 Kbit/second encoding scheme used in the preferred embodiment requires more bandwidth than is provided by a given technology with which the encoding scheme is to be used, a similar encoding scheme with a lower frequency, such as 8 kbits/sec, can be used. Although other embodiments of the invention could use even lower data rates, it is preferred that a scheme be used in which a substantial portion of the energy of the encoded machine readable signal be above a relatively high frequency, such as above 5 kHz. The ability of most humans to distinguish audio frequencies decreases at higher frequencies. If the major portion of the energy of the encoded signals is above 5 kHz, and if this signal is placed in a portion of an audio signal containing substantial energy between approximately 2 kHz and 5 kHz, most people will find it quite difficult to even notice the encoded signals.

FIG. 1 displays a plurality of waveforms for carrying encoded information 30, 32 and 34, and time scales 36 and 38 which show clocking information used to help encode or decode such waveforms.

The digital waveform 30 is a pulse code signal which encodes information at a rate of ten thousand bits per second. The signal is created in conjunction with the clocking information shown in the time scale 36. This time scale represents a 10 kHz clocking signal, represented by its large pulses 40, and a 30 kHz clocking signal represented by both its large pulses 40 and its smaller pulses 42. Each bit period of the digital waveform 30 extends from one of the 10 kHz clock pulses 40 to the next such pulse. It includes a positive (or rising) edge 44 which occurs at the 10 kHz clock pulse 40 which starts the bit period. If the bit associated with the bit period is a zero, it has a falling edge 46 which occurs at the first 30 kHz clock pulse signal 42 after the period's rising edge 44. If, on the other hand, the bit associated with the bit period is a one, it has a falling edge 48 which occurs at the second 30 kHz clock signal 42 after the period's edge. The signal 30 is a self clocking signal since it contains a rising edge every ten thousandths of a second, at the start of every bit period. If the bit is zero, the signal will stay high for one third of its bit period, and if it is a one it will stay high for two thirds of its bit period.

When the digital waveform 30 is recorded by, or transmitted over, analog audio frequency circuits it tends to lose its sharp edges. This is so because the transmission or recording of such sharp edges requires frequencies above those which most audio circuits are capable of transmitting or recording. Thus, once the digital waveform 30 has been transmitted or recorded by such analog audio frequency circuits it tends to have the smoothed appearance of the analog waveform 32.

When the analog waveform 32 is to be decoded, it is passed through a digitizing gate. The digitizing gate produces an output which is either high or low, depending on whether the current value of the signal 32 is above or below a middle value, or threshold, represented by the line 50 shown in FIG. 1. The resultant output is a reconstructed digitized signal 34. This reconstructed signal should appear quite similar to the original digital signal 30, except that the timing of its rising and falling edges will probably vary somewhat from that of the original digital waveform 30. This will result from such factors as signal noise and the attenuated frequency response which most audio circuits have near the upper end of their bandwidth.

An asynchronous 200 kHz clock signal is used locally by the decoder circuitry for asynchronous code demodulation. The output of this 200 kHz clock is indicated by both the large pulses 54 and the small pulses 56 of the time scale 38. This 200 kHz clock has approximately twenty pulses for each bit period of the approximately 10 kbit/sec signal 34. The counting of these pulses starts with each positive going edge 52 of the signal 34. The tenth of these approximately twenty pulses is used as the bit sampling time. This tenth clock pulse is indicated by the vertical dotted lines 58 shown in FIG. 1. If the reconstructed signal 34 has a high value during a sampling time, its associated bit period is detected as having a one value. If it has a low value during the sampling time, the bit period is detected as having a zero value.

Figure 2:
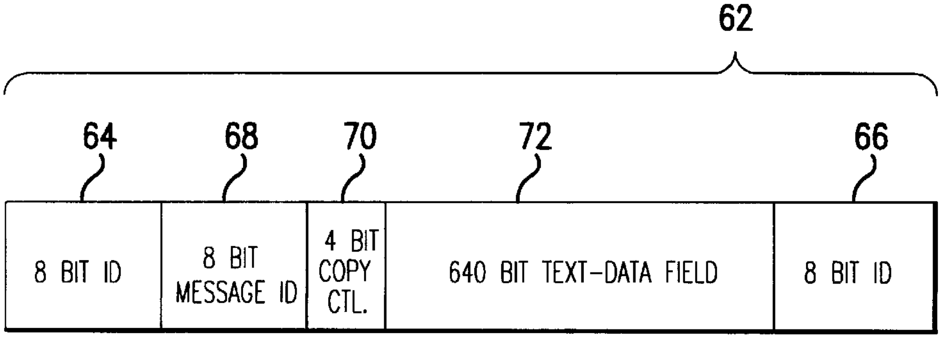
FIG. 2 is a schematic diagram of the data structure of a burst of encoded machine readable information, which is used by a preferred embodiment of the present invention, and which stores a complete label for a musical selection.

FIG. 2 illustrates the data structure with which information is encoded using the technique described with regard to FIG. 1 in a first preferred embodiment of the present invention. In this embodiment information is encoded in a 668 bit unit, or data burst, 62. This burst contains two eight-bit ID fields 64 and 66 at the beginning and end of the burst, respectively. The function of these ID fields is to provide an eight bit pattern which must be detected at both the beginning and end of any group of 668 consecutive bit periods in the reconstructed signal 34 for that signal to be recognized as a valid data burst.

The next field in the data burst is the eight bit message ID field 68. This field identifies the type of data burst to which it belongs. For example, in the preferred embodiment it identifies whether the data burst is being used to identify musical selections or for other purposes, such as to carry programming information on the audio portion of television channels, etc. When the data burst is being used to identify musical selections recorded on a record, tape, or CD album, this field 68 further identifies whether the data burst is before the start, after the end, or during a musical selection.

The next field is the four bit copy control field 70. As is explained below in detail, this field is used to determine the conditions under which certain hardware can copy or otherwise use the audio signal in which the encoded data bursts have been placed.

The next field is a 640 bit text data field 72. When the data burst is used to identify musical selections, this field contains four lines of twenty bytes each. The first line identifies the artist performing the musical work. The second names the song, the third names the album from which the selection comes, and the fourth names the record company which sells the album.

When the data burst is used for purposes other than labeling musical selections, the bytes of the text data field 72 can be divided in other ways.

It should be appreciated that in other embodiments of the invention the structure of data bursts could be different. For example, extra data fields could be added to indicate such additional information as the elapsed time of each musical selection at which a data burst occurs, the catalog number associated with a recording, the date on which the work was recorded, or the work's composers. If the data burst were used for purposes of transmitting information about subjects other than musical selections, such as television programming information, or weather information, its field structure might differ even more. In alternate embodiments, each data burst could contain error correction and detection bits, to reduce the chance that the data contained in such bursts would be misinterpreted.

The data burst 62 shown in FIG. 2 contains 668 bits which are transmitted at a rate of ten thousand bits a second, as is explained above with regard to FIG. 1. This means that the entire burst only lasts 0.0668 seconds, or approximately one fifteenth of a second. A burst of such a brief duration would be heard at most as a very brief click, regardless of the frequency at which it was recorded.

Figure 3A:
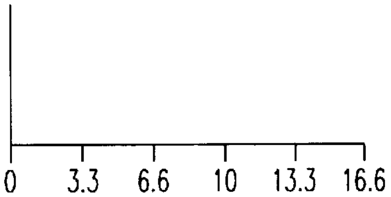
FIGS. 3A–3J are diagrams illustrating the energy content at various portions of the audio spectrum of the encoded machine readable information signal, at various portions of an audio signal intended for human listening, and the energy distribution of the signals which result when the encoded information signal is added to the audio frequency signal intended for human listening.
Figure 3B:
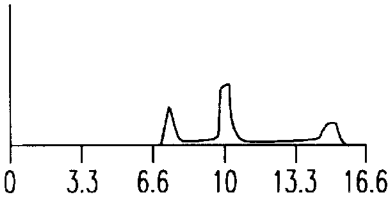

FIGS. 3A–3J are graphs representing energy in the vertical direction and frequency along the horizontal axis. FIG. 3B shows a rough approximation of the energy spectrum associated with a data burst of the type described above with regard to FIGS. 1 and 2. We shall refer to the frequency range in which most of the energy associated with the data bursts occurs as the encoding frequency range. Because the data burst described with regard to FIGS. 1 and 2 has a bit rate of 10 kHz, most of the energy is above 6.6 kHz and thus the encoding frequency band is above 6.6 kHz. At such high frequencies most people's ability to hear sound is greatly reduced. As a result, the click-like sound produced by such a data burst will be barely audible to most listeners. This will be true even if the burst is recorded over a totally silent audio signal period, such as that represented in FIG. 3A. In this case the signal produced by combining the signals represented in FIGS. 3A and 3B has the spectrum shown in FIG. 3B.

Figure 3C:
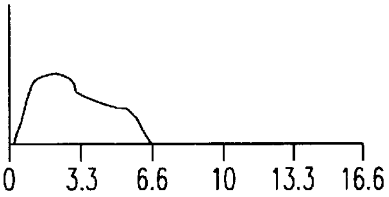
Figure 3D:
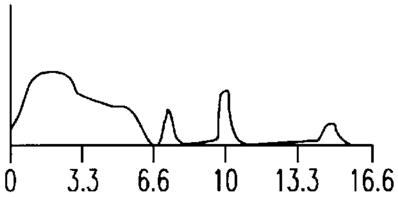

In the preferred embodiment of the invention, however, the system takes steps to reduce even further the chance that listeners will be annoyed by whatever slight audible click is associated with data bursts. It does this by monitoring the musical selection in which data bursts are to be placed to find locations in which such clicks will be well hidden by sound from the musical selection. In one embodiment of the invention this is done by simply recording the data bursts over temporal portions of the musical selection in which there is a relatively large amount of energy below the 6.6 kHz lower boundary of the encoding frequency band, but yet very little energy above 6.6 kHz in the encoding frequency band itself. Such a desired energy spectrum is shown in FIG. 3C. The spectrum of the combined signal which results when a data burst is added over such an energy spectrum is shown in FIG. 3D. An energy spectrum of this type is desired because the relatively large amount of energy below the encoding frequency band tends to mask whatever audible click is associated with the burst. At the same time the relatively small amount of energy in the encoding frequency band tends to reduce any chance that the information of the data burst recorded over that signal will be distorted by interference with the underlying audio signal.

Figure 3E:
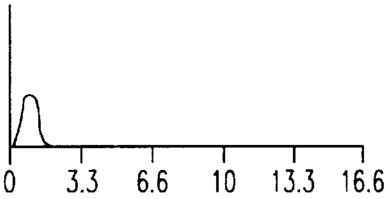
Figure 3F:
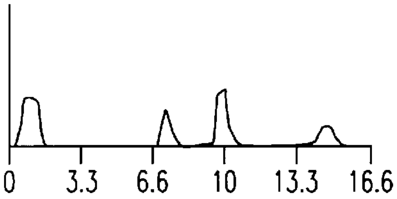

It is particularly desired that the energy spectrum over which the data burst is added have a fair amount of energy in frequencies which are close to the lower limits of (i.e., proximally below) the encoding frequency band (e.g., between 3.3 kHz and 6.6 kHz when the data burst is above 6.6 kHz). That is why a portion of the underlying audio signal with only relatively low frequencies as shown in FIG. 3E is not as good as the one shown in FIG. 3C, which has a fair amount of relatively high frequency sound. This is because high frequency sounds are better at masking the even higher frequency sound of the data burst than are low frequency sounds. This is indicated by the comparison of FIG. 3F, which shows the spectrum produced by recording a data burst over the underlying signal shown in FIG. 3E, with FIG. 3D. In FIG. 3F the acoustic energy associated with the data burst stands out much more than in FIG. 3D.

Figure 3G:
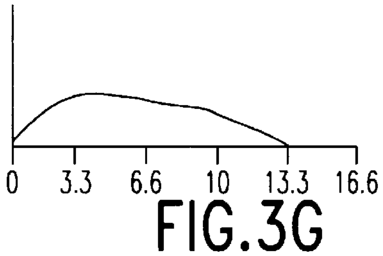
Figure 3H:
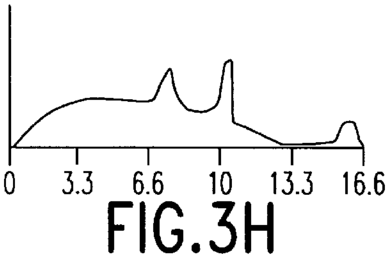
Figure 3I:
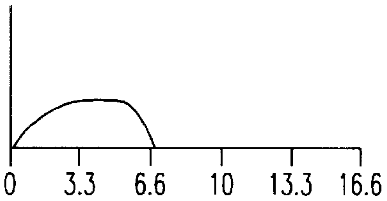

If a data burst is recorded over a portion of an underlying audio signal which has a lot of energy in the encoding frequency band, as is shown in FIG. 3G, the energy from the underlying signal is likely to interfere with the proper decoding of information contained in that data burst, as is indicated by the resulting combined spectrum shown in FIG. 3H.

The embodiment of the invention described above which simply records data bursts over portions of the underlying audio signal which have a relatively large amount of sound below the encoding frequency band, but relatively little energy in the encoding frequency band itself, will function well, provided the system can count on finding such portions in the underlying signal. However, if the only portions of the underlying signal which contain a relatively large amount of energy below the encoding frequency band also include a fair amount of energy in that band itself, it will be forced to record its data bursts in other portions of the signal which will not hide the data burst's click nearly as well. This is particularly a problem since those portions of the underlying signal which are best at hiding the data burst's click sound are also the most likely to have a fair amount of energy in the encoding frequency itself.

Figure 3J:
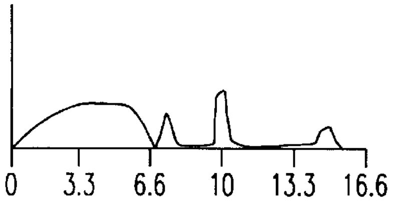

A second embodiment of the invention has been designed to avoid these problems. It has the ability in effect to cancel sounds in the encoding frequency band out of those portions of the underlying signal over which data bursts are recorded. This is illustrated with regard to FIGS. 3G, 3I, and 3J. In this embodiment, the system looks for portions of the underlying audio signal which have a relatively large amount of audio energy close to, but below (i.e., proximally below), the encoding frequency band, such as the portions whose spectrum is shown in FIG. 3G. When it finds such portions of the underlying signal, it cancels the acoustic energy from those portions which lie within the encoding frequency band, causing the spectrum of those portions to have the appearance shown in FIG. 3I. Then it records the data burst over the spectrum shown in FIG. 3I to produce a combined spectrum as shown in FIG. 3J.

Figure 4:
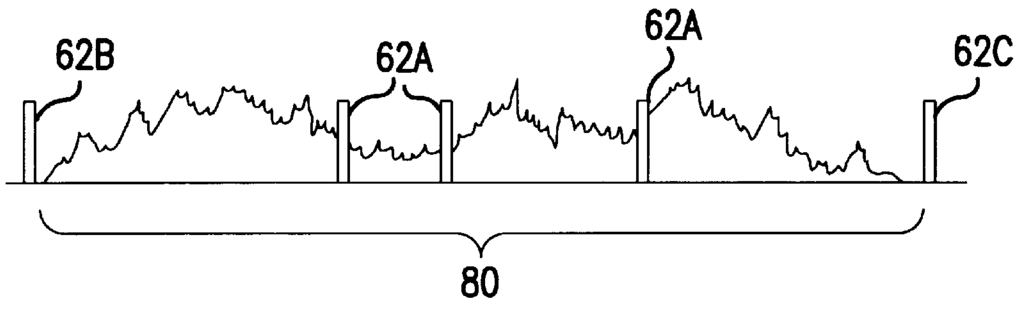
FIG. 4 is a schematic representation of the audio signals of a recorded musical selection in which bursts of encoded machine readable information of the type shown in FIG. 2 have been added.

FIG. 4 illustrates the location of data bursts relative to a musical selection 80 recorded on a record, tape, or compact disc. The horizontal axis represents time and the vertical axis represents amplitude. The length of the selection is indicated by the width of the horizontal bracket labeled with the numeral 80. Each such musical selection has three data bursts 62A of the type shown in FIG. 2 recorded within it, one data burst 62B recorded before its start, and one data burst 62C recorded after its end. The data bursts 62A, 62B, and 62C all have the same form, except that the eight bit message ID 68 differs between them to indicate if the burst is located in, before, or after its associated musical selection. Multiple data bursts are encoded in each selection in case noise or other interference prevents proper decoding of any one of such bursts. The data bursts are provided before and after each song to inform playback machinery of the start and end of each song.

Figure 5:
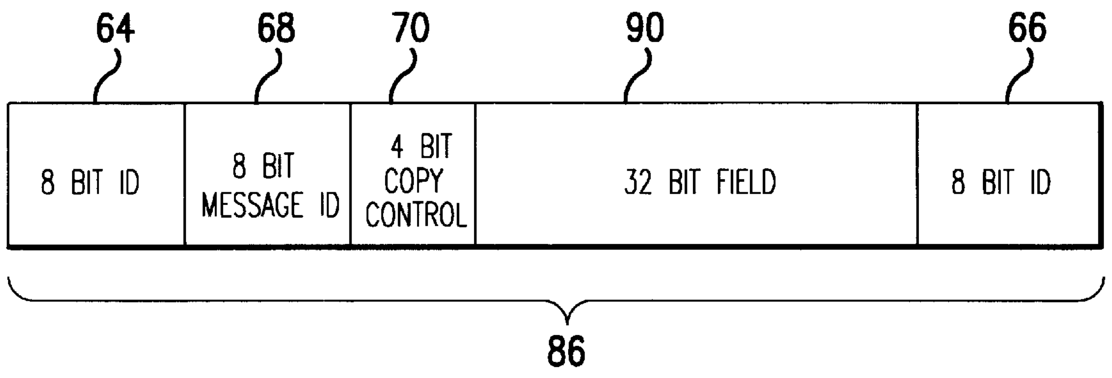
FIG. 5 is a schematic diagram of the data structure of a burst of encoded machine readable information, which is used by another preferred embodiment of the present invention, and which stores only a part of a label for a musical selection.
Figure 6:
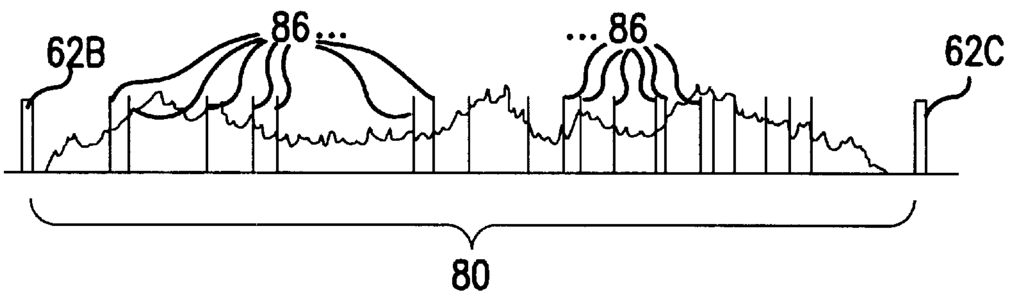
FIG. 6 is a schematic representation of the audio signals of a recorded musical selection to which bursts of encoded machine readable information of the type shown in FIG. 5 have been added.

FIG. 5 illustrates a type of data burst 86 which can be used with alternate embodiments of the present invention. The data burst 86 is only 60 bits long. At the 10 kHz data rate described above it can be transmitted in 0.006 second, or less than one hundredth of a second. The data burst 86 contains two eight bit ID fields, one 64 at its start, and one 66 at its end. These fields are the same as the correspondingly numbered eight bit ID fields described above with regard to FIG. 2. It also includes an eight bit message ID field 68 and a four bit copy control field 70, similar to the corresponding numbered fields shown in FIG. 2. Finally it includes a 32 bit data field 90. In each data burst 86 recorded within a musical selection, this field is used to carry a portion of the information carried in the field 72 of FIG. 2. It requires twenty of the shorter data bursts 86 to carry as much data as one of the longer data bursts shown in FIG. 2. This is indicated in FIG. 6 in which the same musical selection shown in FIG. 4 is shown with twenty short data bursts 86 placed within it. Preferably the set of twenty data bursts should be repeated several times in each musical selection, to provide redundancy in case one of the bursts in one of the sets of twenty cannot be properly decoded. The data bursts 62B and 62C, before and after each selection respectively, are the same 668 bit data bursts as are shown before and after the musical selection in FIG. 4.

Figure 7:
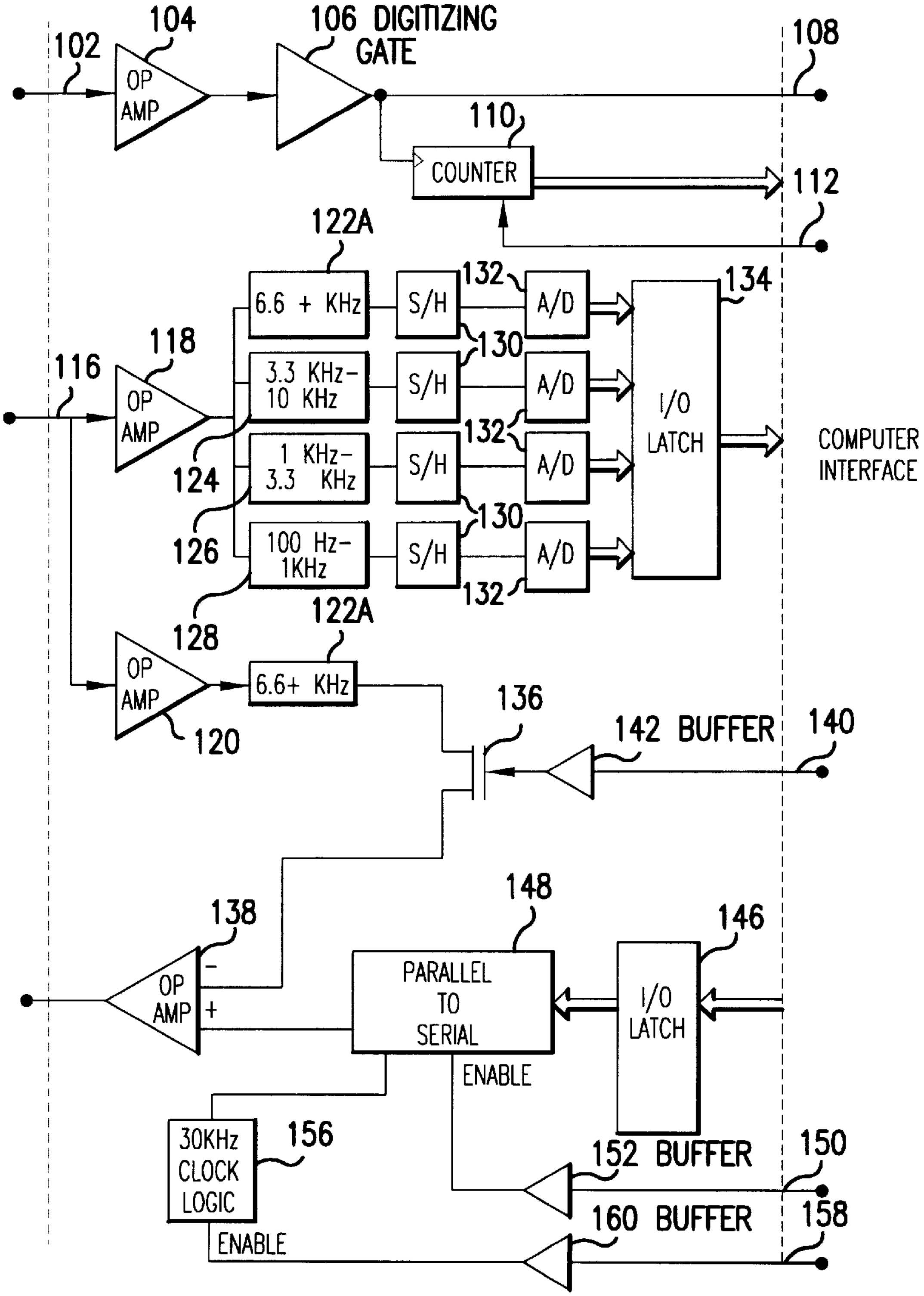
FIG. 7 is a schematic block diagram illustrating encoding circuitry according to one preferred embodiment of the present invention which is used to monitor a first audio signal intended for human listening and to record bursts of encoded machine readable information of the type shown in FIGS. 2 or 5 at selected locations in that first audio signal.

FIG. 7 illustrates the special purpose circuitry 100 which is used to record data bursts in musical selections when a master of a musical album is made. To the left of the circuitry 100 is a tape playback and recording machine (not shown). To the right of the circuitry 100 is a computer (not shown), such as a standard personal computer.

In the preferred embodiment, the circuitry 100 is used in a two pass manner. In the first pass a musical selection which is to have encoded data bursts placed on it is played back from a master tape so that the computer used with the system can select locations in the musical selection which are best suited for the recording of the data bursts. This decision is made according to the criteria described above with regard to FIGS. 3A–3J. Once these locations have been selected, the system performs a second pass. During the second pass the musical selection is again played back from the master tape, and when the selected locations in that musical selection occur the computer causes data bursts to be recorded onto a separate track of the master tape. Once this has been done the signals containing the track with the bursts are mixed with the other tracks to produce one audio signal which can be recorded on a tape or CD. Where stereo recordings are being made the bursts can be recorded on one or both of the stereo channels, and, preferably one of the bursts in one of the stereo channels temporally corresponds with a corresponding inverse amplitude burst in the other of the stereo channels. For purposes of simplification, however, the circuit shown in FIG. 7 is shown as only dealing with one audio channel.

In the embodiment of the invention shown in FIG. 7, portions of the musical selection over which data bursts are recorded have that part of their energy spectrum which is in the encoding frequency band canceled to prevent interference with the data burst. As is explained in greater detail below, this is done by recording on the same track as the encoded data bursts a signal which is the inverse of those portions of the musical selection's audio signal which are in the encoding frequency band.

Turning to the circuitry 100 in more detail, a tape synchronization signal from the tape machine is supplied to an input 102 of the circuitry 100. This signal is generated at fixed time intervals, such as at every one hundredth of a second, throughout the playback of a musical selection from the first tape. From this input, the synchronization signal is supplied to the input of an operational amplifier 104, which amplifies it. The output of the amplifier 104 is supplied to the input of a digitizing gate 106, which digitizes it. Thus, the output of this digitizing gate has a binary value of one when the tape synchronization signal is above a median value and a binary value of zero when that signal is below that median value. This digitized synchronization signal is supplied to an output 108, which is connected to an input port of the computer used with the circuitry 100. The digitized synchronization signal produced by the gate 106 is also supplied to the input of a counter 110. This counter is reset before the playback of each musical selection. This is done by a reset signal supplied by the computer to an input 112 of the circuitry 100. Thus, during the playback of a given musical selection, the counter 110 holds a cumulative count of all the synchronization pulses generated since the start of the playback of the song. This cumulative count provides a means for labeling locations on the tape which are selected by the computer during the first pass at which to record data bursts. On the second pass, counter 110 enables the computer to synchronize the recording of such data bursts with the playback of those selected locations.

An input 116 receives the audio signal from the source during both the first and second passes. The audio signal supplied to this input is fed into operational amplifiers, 118 and 120. The output of amplifier 118 is used in the first pass playback, and the output of amplifier 120 is used in the second pass playback.

The amplifier 118 amplifies the audio signal which it receives, and supplies that amplified signal to the inputs of four separate band-pass filters 122, 124, 126 and 128. The band-pass filter 122 passes portions of the audio signal which are in the encoding frequency band, that is, which are above 6.6 kHz. The filter 124 passes portions of the audio spectrum which are in the range of 3.3 kHz to 6.6 kHz. The filter 126 passes portions of the spectrum which range from 1 kHz to 3.3 kHz, and the filter 128 passes portions which range from 100 Hz to 1 kHz.

The output of each of these band-pass filters is supplied to a sample and hold circuit 130, which samples and holds its analog value at a fixed time controlled by the computer (through a line not shown in FIG. 7). The analog value held by each sample and hold circuit 130 is supplied to the input of an A/D converter 132, which converts that analog value into a corresponding multi-bit digital value. The digital value produced by each A/D converter 132 is supplied to the input of an I/O latch 134. The output of this latch is supplied to an I/O port of the computer used with the circuitry 100.

Those skilled in electronics will appreciate that each of the band-pass filters 122, 124, 125 and 128 and its associated sample and hold circuit 130 and A/D converter 132 produce a digital sampling of the value, at successive sampling times, of the portion of the audio signal supplied to the operational amplifier 118 which lies in the frequency band associated with each band-pass filter frequency range. By monitoring these instantaneous values over time, the computer used with the circuitry 100 can make an approximate calculation of the amount of energy in that frequency band. From this information the computer can choose the temporal portions of the musical selection which have the desired energy spectrum, as was described above with regard to FIGS. 3A–3J.

As stated above, the output of the operational amplifier 120 is used during the second pass playback of the musical selection, in which data bursts are recorded onto a track of the master tape. The amplifier 120 receives the audio signal of the musical selection and amplifies it. The output of the operational amplifier 120 is supplied to the input of a band-pass filter 122A, which is identical to the band-pass filter 122 described above. This filter passes that part of the audio signal of the musical selection which has frequencies in the encoding frequency band, which ranges from 6.6 kHz up. The output of this band-pass filter is supplied to the gated input of a gating transistor 136. The output of this transistor is supplied to the negative input of a summing operational amplifier 138. The other input of the summing amplifier 138 receives the signals associated with data bursts when such bursts are to be recorded.

During portions of the musical selection for which the gating transistor 136 is turned on, the part of the audio signal which lies in the encoding frequency band is largely canceled. This is because during those portions, the data burst track on the master tape will receive a negative version of that part of the signal which lies in the encoding frequency. It will receive this negative version of the signal through the band-pass filter 122A, the gating transistor 136, and the amplifier 138. When the recording on the master tape is finally combined into one audio signal, such as for recording on one channel of a stereo recording, the combination of the negative version of the portion of the musical selection in the encoding frequency band with the original signal in that selection in that frequency band will substantially cancel each other out, preventing interference with the data bursts.

It should be appreciated that, depending on the exact detail of the implementation of the circuitry shown in FIG. 7, phase changes and time delays caused by passing frequencies above 6.6 kHz in the musical signal through the filter 122A, the transistor 136, and the amplifier 138 might reduce the effectiveness with which this cancellation process occurs. Those skilled in the art of audio signal processing will appreciate that such delays and phase change can be compensated for by placing compensating delay or phase change circuits in either the path of the entire audio signal or the path of the signals above 6.6 kHz. For even greater precision, digital techniques could be used to perform the cancellation process or to overcome any phase changes or delays engendered by the circuitry shown in FIG. 7.

It should also be appreciated that to achieve proper cancellation of the musical selection's sound in the encoding frequency band it is important that the signal fed into the amplifier 120 be fixed in the same manner as the final signal with which signal produced by the amplifier 138 is to be used.

During most of the second pass in which data bursts are recorded on the master tape, the gating transistor 136 is off. This prevents the output of the band-pass filter 122A from passing through to the negative input of the operational amplifier 138, and thus prevents the portion of the audio signal of the musical selection which is in the encoding frequency from being canceled. But when the computer running the circuitry 100 and its associated tape machinery determines that a data burst is to be recorded, it supplies a positive voltage to input terminal 140 which travels through buffer 142 to the gate of the transistor 136, turning it on. This causes the 6.6 kHz portion of the musical selection being recorded to be canceled. The computer determines when to perform such cancellations and to record bursts by monitoring the counter 110 and the digitized synchronization signal 108. When the count of the counter 110 matches that associated with a portion of the musical selection which the computer previously selected for the recording of a burst during the first pass of the two pass process, the computer causes the cancellation and data burst recording process to take place.

When the computer detects that the count in counter 110 is approaching that at which a data burst is to be recorded during the second pass, it loads bits corresponding to a data burst of the type shown in FIG. 2, through a latch 146, into a parallel to serial converter 148. For each bit of the data burst shown in FIG. 2, the computer feeds three bits into the converter 148. If a given bit of the data burst is a zero, its corresponding three bits placed in the converter will be "100". If it is a one, its corresponding three bits will be "110". When a sequence of such three bit patterns are shifted out of the parallel to serial converter at 30 kHz, it will produce a digital waveform such as the waveform 30 shown in FIG. 1. The 668 bit pattern of the data burst shown in FIG. 2 thus requires three times as many bits, or 2004 bits, in the serial to parallel converter 148. The computer feeds this large number of bits into the converter 148 in the following manner. It repeatedly loads byte-wide successive portions of the 2004 bit pattern into the I/O latch 146. Once these bits are in the latch, the computer drives the input 150 high. This high voltage goes through a buffer 152 and is supplied to the activating input of the parallel to serial converter 148. This signal causes the data stored in the I/O latch 146 to be latched into the parallel to serial converter.

Once the parallel to serial converter has been loaded, the computer waits until the cumulative count in the counter 110 and the phase of the digitized synchronization signal on line 108 indicate it is the proper time in the playback of the musical selection to record the data burst. At this time the computer supplies a high voltage to input 158 of the circuitry 100. This high voltage travels, through a buffer 160, to the activating input of a clock logic block 156. This logic block counts and gates 30 kHz clock pulses, causing exactly 2004 consecutive 30 kHz pulses to be supplied to the clocking input of the parallel to serial converter, which causes the waveform associated with each of the 668 bits of the data burst shown in FIG. 2 to be supplied to a positive input of the summing amplifier 138. At the amplifier 138 the data burst waveform is summed with the inverse of the 6.6 kHz portion of the audio signal of the musical selection being re-recorded. This summed signal containing the data burst is then recorded on the data burst track of the master tape. When the signal recorded on this track is added to that from the other tracks of the master tape which were fed into amplifier 120, the resulting audio signal, during portions of the musical selection in which data bursts are recorded will have the frequency spectrum of the type illustrated in FIG. 3J. In such a frequency spectrum the portion of the audio signal of the musical selection which lies in the encoding frequency band has been largely canceled and has been replaced by the data burst signal.

Figure 8:
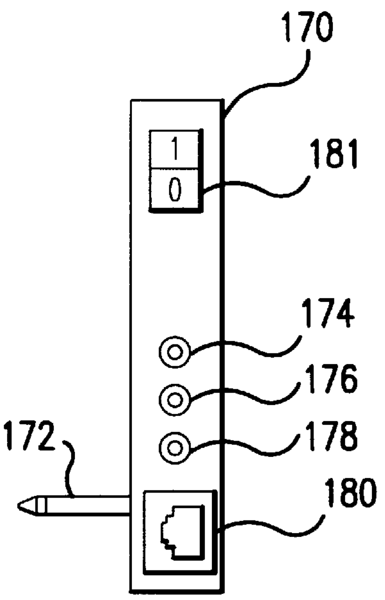
FIG. 8 is a side view of a device for plugging into an audio-out jack of a radio tuner or receiver, extracting information bursts of the type shown in FIGS. 2 and 5 from the audio signal outputted at such a jack, and decoding, storing, and displaying the information contained in such bursts.
Figure 9:
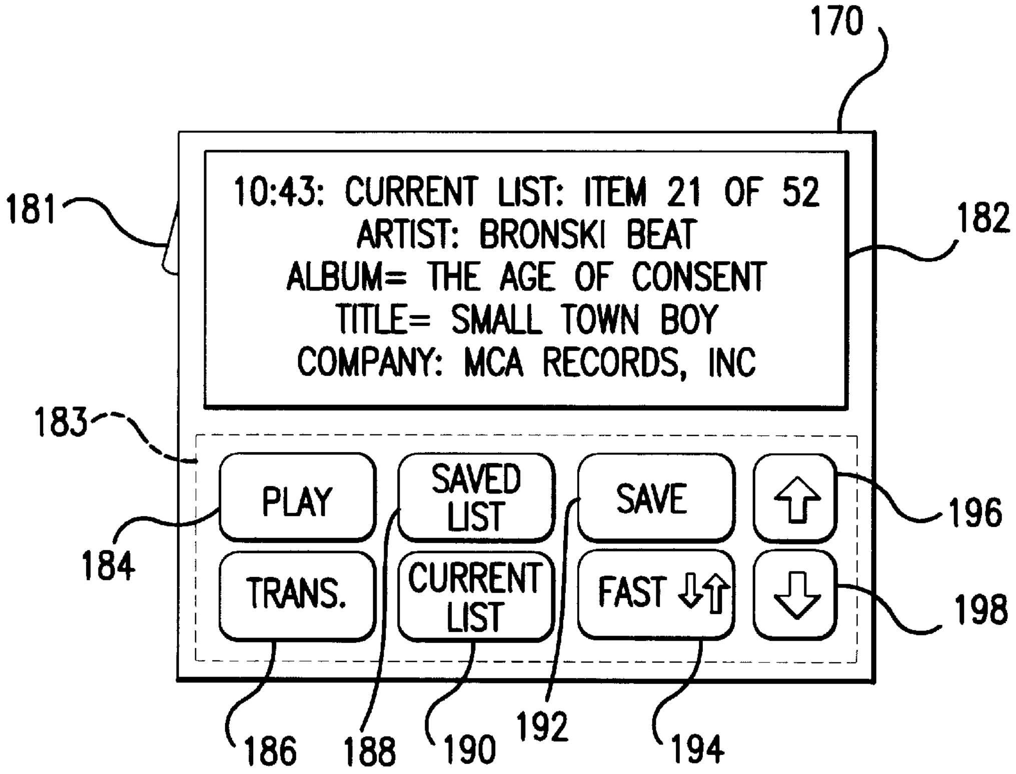
FIG. 9 is a front view of the device shown in FIG. 8.

FIGS. 8 and 9 illustrate the external appearance of a preferred embodiment of a decoding device 170 of the present invention. As is shown in FIG. 8, this device includes an audio plug 172 which is designed to fit into a standard audio-out jack of the type commonly found on tape players, receivers, televisions and the like. The decoder 170 includes three audio jacks, 174, 176 and 178.

The jack 174 is an input jack. It is to be used with a cord having a male plug at each end if it is inconvenient or impossible to use the plug 172 directly with the output jack of whatever piece of audio equipment the decoder 170 is to be used. Preferably the plug 172 is designed so that it can fold up when it is not in use. The jack 176 is an audio-out jack which is directly connected to the plug 172 and the audio in jack 174. Its purpose is to enable other audio devices such as earphones to receive the audio output of whatever device the decoder is being used with at the same time the decoder itself is being used. The jack 178 is an audio-out jack, from which brief recorded segments of musical selections whose labels are currently stored in the decoder can be heard.

The decoder 170 also includes a phone jack 180. This jack is used in conjunction with a modem which is built into a preferred embodiment of the invention to enable the decoder to transfer a list of labels stored within it to a personal computer, or to a vendor of recorded music. The decoder also includes an on-off switch 181, which is used to turn it on or off.

FIG. 9 shows the front side of the decoder 170. This side contains a liquid crystal display 182 and a keyboard 183, which is indicated with dotted lines. This keyboard contains eight buttons, or keys, 184, 186, 188, 190, 192, 194, 196 and 198. The display 182 contains five lines. The first line displays the time and date at which the musical selection shown on the display was detected by the decoder. This time information is produced by the microcomputer 214 and the clock logic 185 shown in FIG. 10. The first line also includes an indication of whether the display is showing labels from its current list or its saved list. Whenever the system is turned on and supplied with an audio signal it will add the label of any musical selection which it decodes from any data bursts it detects to the start of the current list. Thus the current list is a list, in reverse chronological order, of all the musical selections detected by the decoder. When the memory space available for the recording of labels for new musical selections becomes filled, the system records over oldest labels in the current list, enabling it to constantly keep track of recent musical selections. The saved list is a list of labels which the user has saved for later use, such as using the decoder's modem to send them to his or her personal computer or to a company which sells recordings. The embodiment described here has enough memory to store a total of one hundred labels, and an accompanying sound segment from the musical recording for each label, in both the current and saved lists.

The first line also carries an indication of the number of the currently displayed label, or item, in the list being shown, and the total number of labels in that list. In both the current and saved lists, labels are numbered in reverse chronological order, with the most recent item being labeled item 1. This number helps user know where there are in the list whose labels are currently being displayed.

The second through fifth lines of the display contain the actual label information which describes an associated musical selection. The second line includes the artist of the selection; the third, the name of the album in which it is included; the fourth, the title of the selection itself, and the fifth, the recording company which sells it.

The up and down buttons 196 and 198 respectively enable the user to move within the currently displayed label list. Each time the up button 196 is pressed the next lower numbered label in that list will be displayed. Each time the down button 198 is pressed, the next higher numbered label in that list will be displayed. If an attempt is made to move past the beginning or end of a list with these buttons, a beep will be sounded by a tone generator 199 in the decoder. The buttons 196 and 198 repeat. That is, if they are continuously pressed for more than one half second, the decoder will repeatedly move the view of the displayed list up or down at a rate of four times a second. If the user pressed the fast button 194 while at the same time pressing the up or down button, the system will skip five positions in the displayed list for every press of the up or down button. If the fast key is pressed while the up or down buttons are repeating, it can be seen that the system can very quickly move to the start or end of a list of up to one hundred labels.

If the save/unsave button 192 is pressed when the current list is displayed, the label currently shown in the display 182 will be added to the front of the saved list. If the button 192 is pressed when the saved list is displayed, it will cause the system to beep, and put a message on the display 182 stating that if the user presses the save/unsave button again the currently displayed label will be deleted. If, when in the saved list, the user presses the save/unsave button while pressing the up or down buttons, when the user releases his or her finger from the save/unsave button the system will place a prompt on the display informing him of the numerical range of the items he has marked for un-saving, and stating that if he or she presses the save/unsave button again all the items in that range will be deleted.

The saved list button 188 and current list button 190, when pressed cause the decoder to display items from the saved list or the current list, respectively. When the play button 184 is pressed the system will play back over the audio output jack 178 a brief recorded segment of the musical selection whose label is currently shown in the display 182.

When the transmit button 186 is pushed the decoder's display will pop up prompt menus that enable the contents of the saved list to be transmitted via modem to computer, including the computer of a recorded music vendor who would treat the list as an order. When the decoder places such prompt menus on the display 182, the user presses the up or down buttons to move a cursor to a desired item on various menu lists and then presses the save/unsave button to select that item. This enables the user to enter telephone numbers which are to be dialed by the modem, and other information necessary to perform a transaction such as purchasing recordings which are on the saved list. In other larger embodiments of the invention, the decoder is provided with removable memory means, such as floppy disk recorders or memory modules onto which the save list can be recorded.

Figure 10:
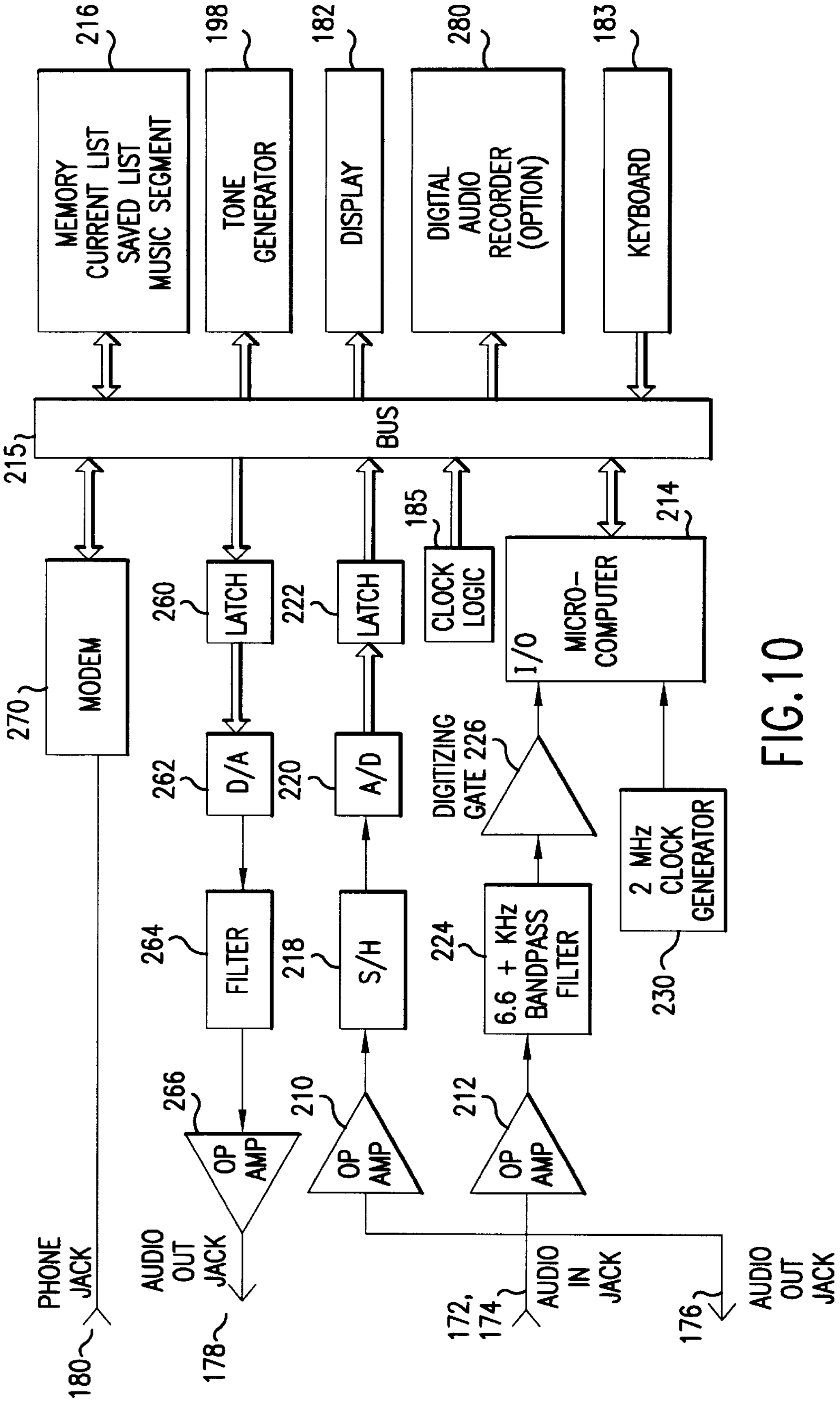
FIG. 10 is a schematic block diagram of the circuitry of the device shown in FIGS. 8 and 9.

FIG. 10 illustrates the major circuit components of the decoder shown in FIGS. 8 and 9. The audio signal to be monitored by the decoder is supplied to the audio input plug 172 or the audio input jack 174, which are shown in FIG. 8. This signal can be supplied by the audio output of a hi-fi, radio, television or other device capable of producing an audio output. As is described above, the audio signal supplied to the audio-in jack 172 is also supplied directly to an audio out jack 176, into which another audio device, such as a pair of headphones, can be connected. The audio signal from the jack 172–174 is supplied to two operational amplifiers, 210 and 212.

The operational amplifier 210 starts a signal path which converts the audio signal, which is in the form of an analog voltage waveform, into a series of corresponding digital values which the single chip microcomputer 214 stores in the memory 216. In this signal path, the operational amplifier 210 amplifies the audio signal and then supplies it to the input of a sample and hold circuit 218. The sample and hold circuit samples and holds the current analog voltage of the audio signal at each of a succession of times. Each of the analog values which is temporarily held by the sample and hold circuit is supplied as the input to an A/D converter 220, which produces a multi-bit digital value corresponding to the voltage held by the circuit 218. The output of the A/D converter is supplied as the input to a latch 222, which latches, or temporarily stores it until the microcomputer 214 has had a chance to read it into memory 216. Although it is not shown in FIG. 10, the sample and hold circuit 218, the A/D converter 220, and the latch 222 all are driven by hardware timing circuitry which causes these components to convert the analog voltage of the audio signal into digital representations at a fixed temporal rate, such as approximately ten thousand times a second. This hardware also produces an interrupt signal to the microcomputer which causes it to read the digital value from the latch 222 and to write it into the memory 216.

In the current embodiment, the microcomputer only records approximately sixteen seconds worth of audio in association which each musical selection, the data bursts of which it detects. In some embodiments of the invention, special data bursts can be used to inform the system of which sixteen seconds of the selection are the best to save in order to remind the user of the selection's general sound. To save memory the microcomputer performs a data compression algorithm to compress the digital representation of the audio signal to approximately five thousand bytes per second. A plurality of such data compression algorithms are known in the art of digital signal processing. Although the audio signal which is reproduced from such a data compressed signal is not a high fidelity signal, it should be about as good as hearing the signal over a telephone. This will be sufficient to remind the user of the system of the basic sound of the musical selection. At five thousand bytes per second, sixteen seconds of data compressed audio will require eighty thousand bytes. To store this amount of information for each of up to one hundred musical selections will require eight million bytes of information. This amount of information would fit on sixteen four megabit DRAM chips. In the future, when the density of components on memory chips increases, it will be desirable to store even longer portions of each musical selection, or alternatively the sound reproduction quality may be increased.

As stated above, the audio signal supplied to the audio in jack 172–174 of the decoder is also applied to an operational amplifier 212. This amplifier is the beginning of a circuit path which detects and extracts data bursts from the audio signal supplied to the decoder and supplies the information contained in each data burst in a form in which it can be used by the decoder's microcomputer 214.

The operational amplifier 212 amplifies the analog audio signal supplied to it and provides that amplified signal to the input of a band-pass filter 224. This band-pass filter has an output which corresponds to the portion of the audio signal supplied to its input which has frequencies over 6.6 kHz, that is, which are in the encoding frequency band. The analog output of the bandpass filter 224 is supplied to the input of a digitizing gate 226, which digitizes it, causing the signal to have one or a zero value, respectively, when the value of the analog output of the band-pass filter is above or below a threshold value. When a data burst is contained in the audio signal supplied to the decoder, the output of the digitizing gate 226 has an appearance similar to the waveform 32 of FIG. 1.

The digitized output from the digitizing gate 226 is supplied to the microcomputer 214. The microcomputer runs on a 2 Mhz clocking signal from a clock circuit 230. The microcomputer will observe the digitized output of digitizing gate 226 every tenth 2MHz cycle (at a frequency of 200 kHz). This observation at a rate of 200 kHz corresponds to the waveform 38 shown in FIG. 1. The bit detection algorithm stored in the microcomputer's ROM detects bits in the following manner. For a portion of the digitized waveform to be detected as a proper bit it must include a positive edge, corresponding to one of the edges 52 shown in the waveform 34 of FIG. 1, which is followed by the waveform maintaining a high value for five pulses of the 20 kHz waveform 38. Then it is required that the signal have a negative edge by the fifteenth 200 kHz clock pulse after the positive edge, and that the signal stay at a low level for at least four 200 kHz pulses. These requirements greatly decrease the chance that signals which are not part of a data burst will be detected as a data burst. They also enable the system to stay in sync with a data burst which is slightly faster or slightly slower than a 10 kHz data rate. If a bit period fails to meet these requirements, the decoding of the entire burst of which the bit is part is invalidated.

If a bit period does meet these requirements, its value is determined by whether the value of the digitized waveform is a high level or a low level at the tenth 200 kHz pulse after the bit period's rising, or positive, edge. If the waveform is high on the tenth clock pulse the bit has a one value, and if it is low the bit has a zero value.

The microcomputer 214 will decode all incoming digitized signals by this method. It will store bits so decoded in on-board memory. During spare cycle times the microcomputer 214 will compare the last eight bits received with a preset eight bit initial ID pattern 64. Once a match is found, the subsequent 652 bits are stored as potentially valid data. The microcomputer then compares a preset ending ID pattern 66 with the eight bit pattern formed by the 653rd through the 660th bits received after the bits which matched the initial ID pattern 64. If the 653rd through 660th bits correspond to the ending ID pattern, a complete data burst 62 of the type shown in FIG. 2 has been received, and the microprocessor will store the 652 bits preceding the ending ID pattern in the memory 216 unless they have already been stored there in response to the decoding of a previous burst from the same musical selection. If either the initial eight bit ID pattern or the ending eight bit ID pattern are not found, all data is ignored until the microcomputer finds the next eight bits which match the initial ID pattern.

When the microcomputer 214 decodes a valid data burst, if the eight bit message field 68 of the type shown in FIG. 2 indicates it is a record label, it stores the label information contained in the text-data field 72 into the top, or most recent position, of the current label list contained in the memory 216. It will normally also display the most recently received label information on the display 182.

The decoder circuitry shown in FIG. 10 includes a circuit path used in the playback of the brief audio samples recorded for each of the up to one hundred labels stored in the decoder. This circuit path consists of a latch 260, a D/A converter 262, a filter 264, and an operational amplifier 266. When the user presses the play button 184 shown in FIG. 9, the microcomputer 214 reads the compressed digital representation of an audio signal associated with the currently displayed label on the display 182. The microcomputer decompresses this compressed digital representation into a decompressed one in which the values of successive digital words correspond to the amplitude of successive parts of the audio signal to be recreated. It then successively feeds these successive digital words to the latch 260. From there each such word is supplied to the D/A converter 262 which converts it to an analog voltage. Although it is not shown in FIG. 10, clocking circuitry is provided to control the time at which the D/A converter 262 converts multi-bit digital values contained in the latch 260 into digital values. The successive analog voltages produced by the D/A converter 262 are passed through a filter 264 which smooths out the steplike changes in voltage produced at the output of the D/A converter 262. The output of this filter is passed through an operational amplifier 266 to the audio out jack 178. From there the user can listen to it over a pair of earphones or plug it into a larger amplifier in order to listen to it over speakers.

The decoder circuitry shown in FIG. 10 also includes a modem 270 which is connected between the decoder's bus 215 and its phone jack 180. As is described above with regard to FIG. 9, this modem allows the decoder to transmit labels contained on its saved list over the telephone lines to a user's own personal computer or to a computer of a record selling service.

As was stated above with regard to FIG. 2, the data burst shown there contains a four bit copy control field. In embodiments of the invention where decoder circuitry is used with a recorder the information contained in this copy control field is used to control the copying of an audio signal containing data bursts including such copy control information. For example the circuitry shown in FIG. 10 could be included in a recording machine, such as a digital audio tape (DAT) recorder. In such a case the audio digitizing path comprised of the input jack 172–174, operational amplifier 210, the sample and hold circuits 218, the A/D converter 220 and the latch 222 should preferably be duplicated to provide for two separate channels, as is required for stereo. In addition, each such path should operate at a high sampling rate with a sixteen bit value produced by the A/D converter 220 for each sample, so as to produce high fidelity stereo digital representations of the sound. In this case an optional digital audio recorder 280 would, under the control of the microcomputer 214 receive these digital samples and record them onto a digital medium such as digital audio tape. However, if the audio signal contains data bursts, the detection circuitry will detect such bursts. If the copy control field of such a burst indicates that the audio signal can only be copied under certain conditions, the microcomputer 214 will not enable the digital audio recorder 280 unless those conditions have been met.

It should also be appreciated by those skilled in the art from the foregoing that the embodiment of FIGS. 8 through 10 can also be incorporated in the circuitry of various common audio devices (e.g., phonographs, receivers, tape players, CD players, tuners, and the like). That is, the signal input to the operational amplifier 210, for example, would be the encoded audio signal generated or received by such device (e.g. the input generated by a phonograph, the input received at an input jack like jacks 172 and 174 from a separate source, or the like). The circuitry, as described in connection with FIG. 10 above, would then operate in substantially the same manner as described above. The keyboard 183 and liquid crystal display 182 or similar apparatus would be exposed in or on the outer portion or cabinet of such device.

Figure 11:
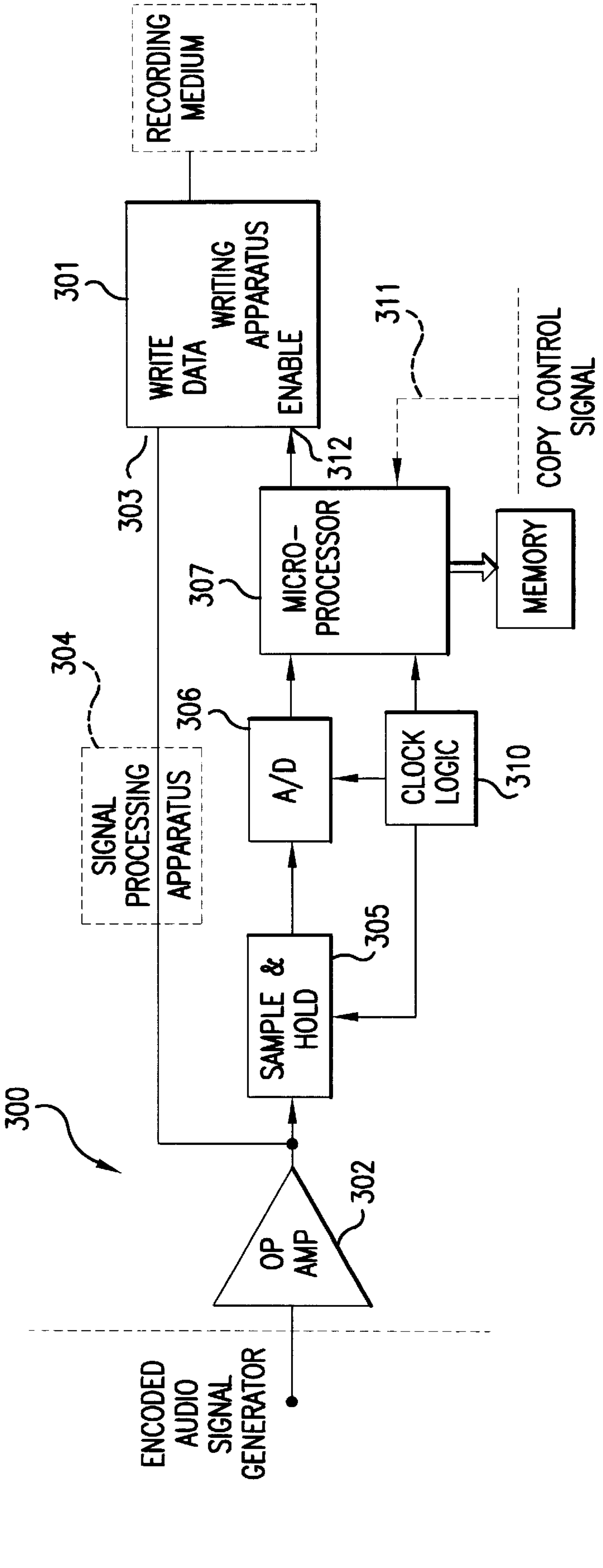
FIG. 11 is a schematic block diagram illustrating the circuitry of a recording device according to one preferred embodiment of this invention which monitors audio signals desired to be recorded and which selectively disables the recording device in response to encoded information in the audio signals.

FIG. 11 discloses a specific embodiment of such circuitry for utilizing the copy control field in the form of recording device circuitry 300 that includes writing apparatus 301 for writing signals to a recording medium for later retrieval therefrom. That is, the writing apparatus copies signals at its input 303 onto a recording medium. The depicted recording circuitry 300 may also be one of several similar circuits of a recording device, such as a stereo tape recorder with each of two such circuits defining a left and right channel, respectively. In this particular embodiment, an operational amplifier 302 receives an analog signal for transfer to the write data input terminal 303 of the writing apparatus 301. Signal processing apparatus 304 may be included between the operational amplifier 302 and the write data input terminal 303 to reduce noise in the input signal as known in the art.

A sample and hold circuit 305 in a parallel path passes a predetermined pattern used for encoding digital information in an analog audio frequency signal, as previously described, to an A/D converter 306. The A/D converter 306 produces a multibit digital value corresponding to the voltage held by the circuit 305. The output of the A/D converter is supplied as the input to a microcomputer or microprocessor 307. Thus, when the input signal comprises an encoded analog audio frequency signal of the type previously described, the microprocessor 307 uses a detecting algorithm and clocking signal from a clock logic circuit 310 that also controls and is connected into the sample and hold circuit 305 and the A/D converter 306.

Upon detecting a copy control message in the encoded data signal (e.g., the 4 bit message 70 of FIGS. 2 and 5), the microprocessor 307 generates a disable signal including, for example, ceasing the generation of an enabling signal, to the enable port 312 of the writing apparatus thereby disabling the writing of the analog audio signals to the recording medium by the writing apparatus 301. Thus, this embodiment of the invention inhibits the unauthorized copying of an encoded analog audio signal of the type disclosed herein. It will be appreciated and understood that a copy authorization signal 311 may be input to the microprocessor 307 to override the generation of the disable signal and thereby enable writing of such encoded analog audio frequency signals.

According to a second preferred embodiment of the invention, the digital information is encoded onto the audio signal using a spread-spectrum signal containing a wide range of frequencies. Spread-spectrum encoding is desirable in that it provides better detectability characteristics in high noise environments; requires less signal power; is insensitive to reverb or similar processing by broadcast stations; is less noticeable to the human ear; and is inherently encrypted and can only be decrypted through use of proprietary decryption key.

Spread-spectrum techniques were initially applied during World War II for jamming resistance purposes in military guidance and communication systems. A spread-spectrum system is one in which the signal occupies a bandwidth that is much greater than the minimum bandwidth necessary to send the information. Spreading is typically accomplished by using a spreading signal or code signal which is independent of the data. At the receiver, despreading (or recovering the original data) is accomplished by correlating the received spread signal with a synchronized replica of the spreading signal used to spread the information.

FIG. 16 is a flow diagram of an encoding sequence for generating a spread-spectrum signal. According to the present invention, the digital information is encoded into a spread-spectrum signal by conversion into a pseudorandom noise (PN) sequence. At step 1601, the desired text (e.g., labeling information) is typed into a computer. At step 1602, the typed text is converted into ASCII binary code. At step 1603, the ASCII bits are converted into a PN sequence representation. Generation of PN sequences for spread-spectrum signals is generally known in the art and can be accomplished in a number of different ways. PN sequences are periodic binary sequences that have the appearance of randomness but which in fact are deterministic. A required property of a PN sequence is its correlation property. By way of example, if a period of the PN sequence is compared term by term with any cyclic shift of itself, the number of agreements should differ from the number of disagreements by not more than one count. However, the present invention does not require and is not limited to any particular correlation property. PN sequences should also have a "balance" property in which, for example, in each period of the sequence, the number of binary ones differs from the number of binary zeros by a predetermined number of digits, and a "run" property in which the length of a sequence of a single type of binary digit is defined as a run and the number of runs of various lengths have predetermined values.

At step 1604, the generated spread spectrum signal is subjected to signal strength scaling to produce a spread-spectrum signal S. This signal S is additionally scaled prior to being added to the audio signal by a novel algorithm which is referred to as Common Mode Scaling (CMS).

FIG. 14 is a diagram of an encoder circuit for Common Mode Scaling a spread-spectrum signal S. A and B are left and right channel signal components of a stereo audio signal, and F is the maximum full scale value of the signal. Both components A and B when received by a radio receiver can only be observed with a limited or truncated accuracy $A_T$ and $B_T$. The spread-spectrum signal S is thus scaled by $(A_T/F)$ on the A channel and $(B_T/F)$ on the B channel. The scaled signal components are then added to the A signal and subtracted from the B signal, so that the encoded audio signals will be $A+(A_T/F)$ and $B-(B_T/F)S$. In FIG. 14, the A and B signal components are inputted from a source such as a master tape into A/D converters 1401 and 1402 where they are converted into digital form. The digital signals are passed through truncation circuits 1404 to obtain the truncated signals $A_T$ and $B_T$. The truncated signals $A_T$ and $B_T$ are then divided by F in divider circuits 1406, and multiplied by the spread-spectrum signal S in multiplier circuits 1408. The signal $(A_T/F)S$ is added to the A signal and the signal $(B_T/F)S$ is subtracted from the B signal in adder circuits 1410. Alternatively, each of the above-identified circuits may be implemented by software or firmware.

Figure 12:
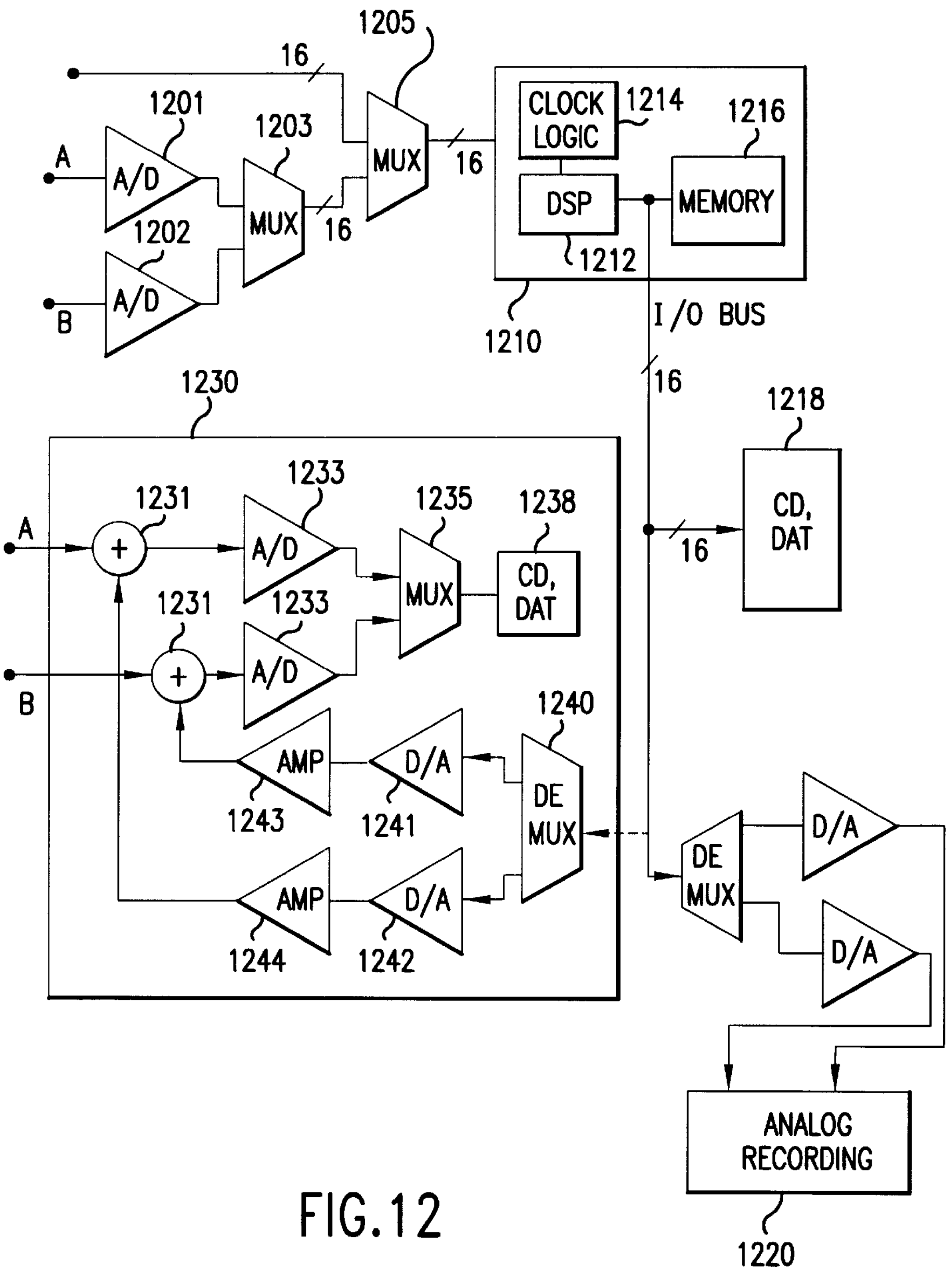
FIG. 12 is a schematic block diagram of an encoder according to a second preferred embodiment of the invention which encodes information onto an audio signal using a spread spectrum signal.

FIG. 12 is a schematic diagram of an encoder device for encoding digital information on an audio signal as a spread-spectrum signal S. Analog signals A and B are inputted to A/D converters 1201 and 1202 which are preferably 16 bit converters. The outputs of the A/D converters are sent to a PC 1210 through multiplexers 1203 and 1205. A 16 bit digital audio signal can also be inputted to the PC 1210 through the multiplexer 1205. The PC includes a digital signal processor (DSP) 1212 which runs off a clock signal generated by clock logic circuit 1214. The PC also includes a memory 1216. The PC encodes the A and B signals as shown in FIG. 14 with the spread spectrum signal S containing the digital information. The resultant signal is then recorded onto a CD or DAT 1218, or onto an analog recording medium 1220.

Additionally, the spread-spectrum signal S may be used to replace the standard dither signal which is always added to an audio signal prior to mastering a CD or DAT. For example, the encoded signal may be added as the dither signals to live analog audio signals A and B into a digital mastering machine 1230 via multiplexer 1240, D/A converters 1241 and 1242, scaling amplifiers 1243 and 1244 and adders 1231. The combined signal is then digitized in A/D converters 1233 and recorded on a CD or DAT 1238 via multiplexer 1235.

Figure 13:
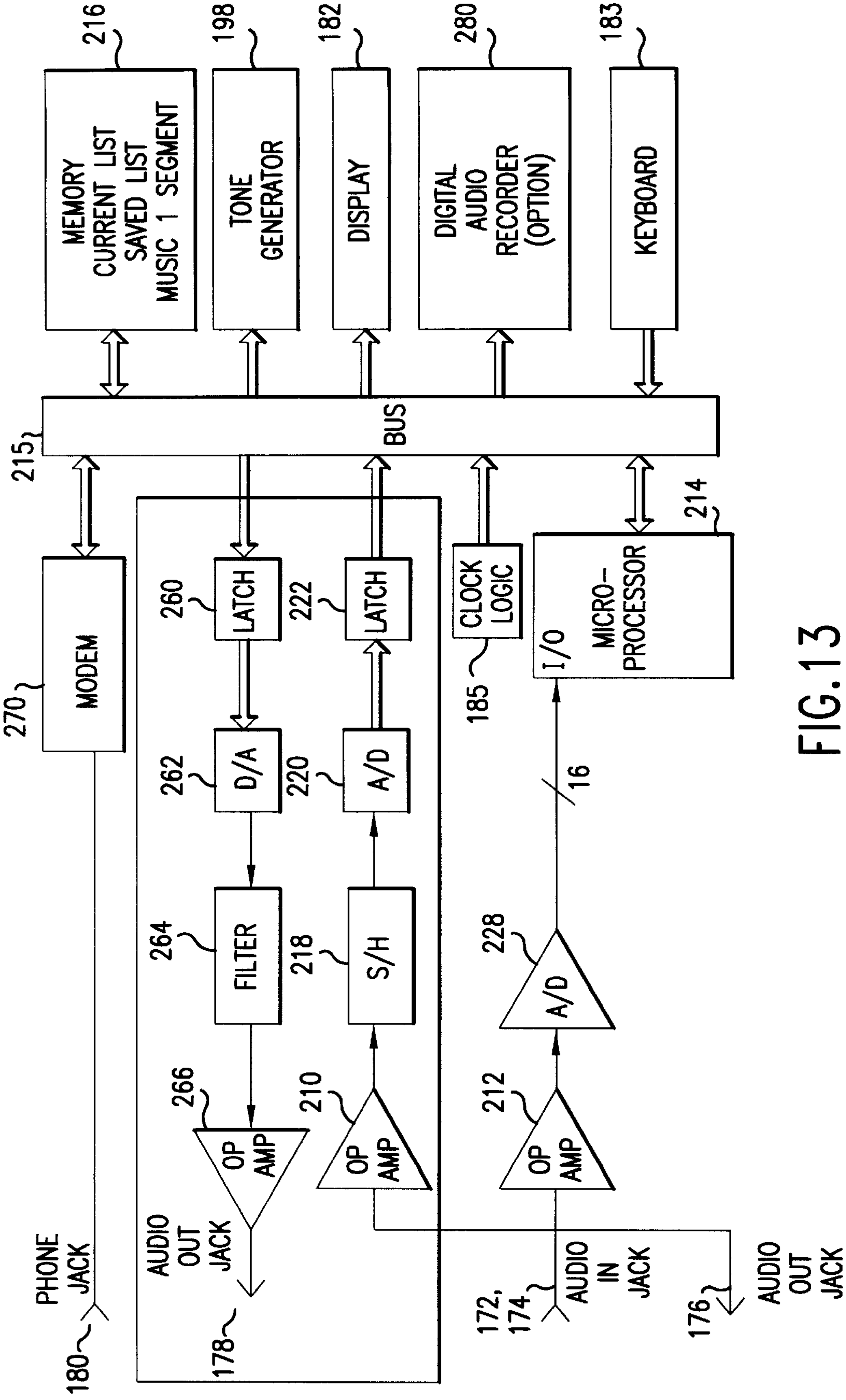
FIG. 13 is a schematic block diagram of a decoder according to the second preferred embodiment of the invention.

FIG. 13 is a schematic block diagram of a decoder for a spread-spectrum encoded audio signal, in which like elements of FIG. 10 are numbered the same and will not be further discussed to avoid duplication. In this embodiment an A/D converter 228 produces a 16 bit digital signal from the analog audio signal input and transmits this digital signal to the microcomputer 214.

Figure 15:
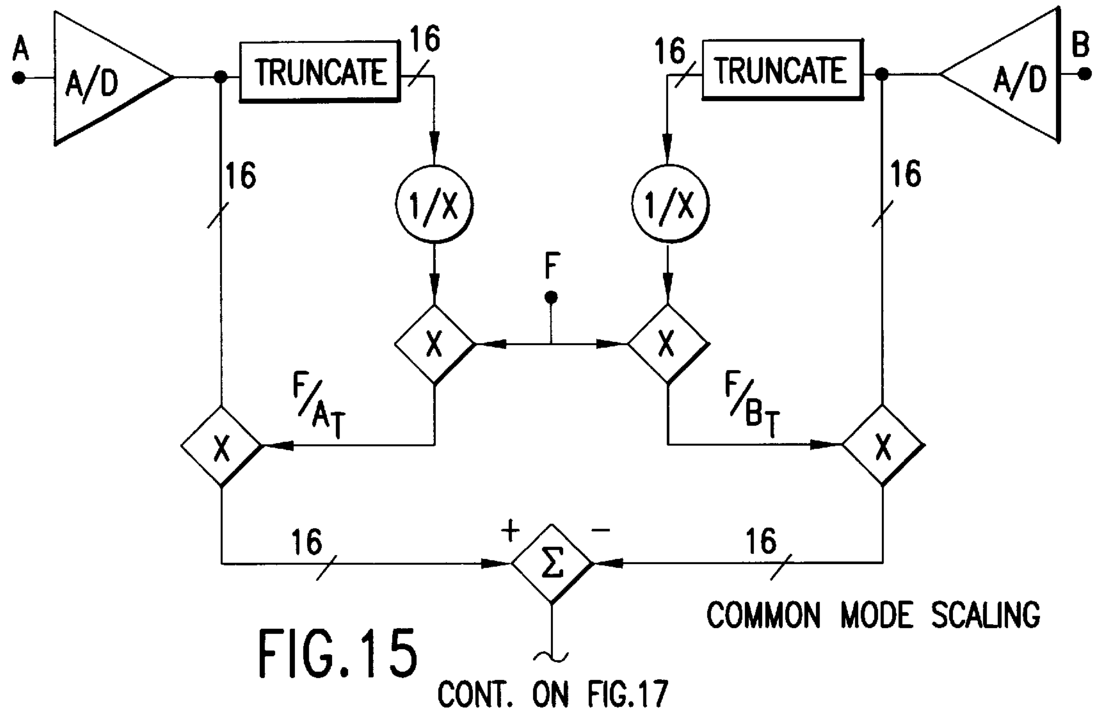
FIG. 15 is a diagram of circuitry for scaling decoding a spread spectrum signal according to the present invention.

FIG. 15 is a diagram of a spread-spectrum decoder implemented by the microcomputer 214 which is the inverse of the encoder shown in FIG. 14. As shown, the received signal components are multiplied by the inverse scaling functions and the B side is subtracted from the A side to obtain a signal approximately equal to twice the spread-spectrum signal, 2S. As will be appreciated, the Common Mode Scaling algorithm completely cancels the audio signal which is the main source of interference, leaving only a negligible small residual signal. This allows the signal S to be at a much lower level and also scales the signal S to the main audio signal so that when the audio signal goes to zero, the S signal also goes to zero.

Figure 17:
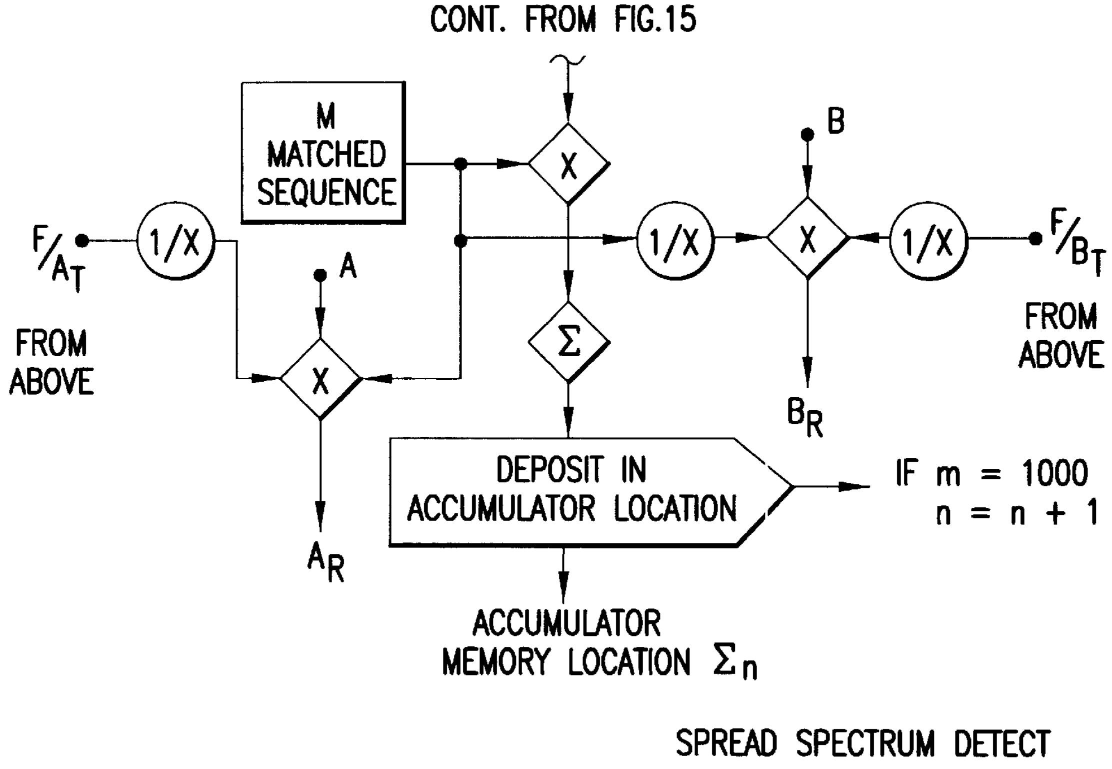
FIG. 17 is a flow diagram for detecting a spread spectrum information signal according to the present invention.

The spread-spectrum sequence length is optimally limited to a fixed number of samples, such as 1000. 1000 sample-long sequences are then continuously correlated with a matched sequence. Upon detecting a match, the accumulator value in the correlator should be a high value. When there is no match the accumulator value should be close to zero. FIG. 17 is a flow chart of the detection process by correlation of a sample sequence SP with a matched sequence M, and is self-explanatory.

The foregoing description and the drawings are given merely to explain and illustrate the invention, and the invention is not to be limited thereto, except insofar as the appended claims are so limited since those skilled in the art who have the disclosure before them will be able to make modifications and variations therein without departing from the scope of the invention.

For example, it should be understood that in alternate embodiments of the invention the decoder could have alternate means for decoding encoded signals and for staying in sync with the signal to be decoded, even if it is played back at widely varying rates. In the preferred embodiment described in this application the encoding technique of the invention is shown being used to label individual musical selections. It should be understood that this invention can be used to label any track from a recorded album, including, for example, a track from a joke album, an album of speeches, or any other type of audio selection.

It should be understood that the present invention is not limited to use with radios, record players, tape players and CD players. Its decoder can be used with any device which receives, or plays back an audio signal or a signal which has an audio component, such as a television signal or a telephone signal. Similarly its encoder can be used to encode audio signals that are transmitted over the airwaves, over cable television networks, or any other media for transmitting audio signals or signals having an audio component. Thus, it is not limited to the encoding information in prerecorded audio signals such as records or tapes. It could, for example, be used to encode current news, traffic reports, stock market information, or broadcasts. Its encoder can also be used to record audio signals on any medium capable of recording such signals, include RAM, ROM, CD ROM, bubble memory, audio tape, video tape, digital audio tape, etc. Further, the signals being transmitted do not need to be analog audio frequency signals but may also be digital audio signals, without departing from the scope of this invention.

It is also to be understood that the decoder of the present invention could take many different forms besides that shown in FIGS. 5 and 10. For example, if the decoder is a separate unit designed to receive the audio output from a hi-fi or other piece of electronic equipment capable of producing audio output signals, it could either be much more complex or much more simple than the embodiment shown in FIG. 9. For example, doing away with the ability to record and play back portions of each labeled musical selection would greatly decrease the amount of memory such a decoder would require and thus reduce its cost. The cost of such a decoder could be further decreased by doing away with its modem and causing it to have a smaller display. It should also be understood that in other embodiments of the invention's decoder the display technology used can vary significantly. For example, light emitting diodes, electroluminescent, gas plasma, printers, or any other type of display technology can be used. It should also be understood that those skilled in the art of designing interfaces for electronic devices may well find other selections and arrangements for the control inputs of such a decoder than those of the keyboard 183 shown in FIG. 9.

In yet other embodiments of the invention, the decoder could be designed as an accessory to a personal or home computer and the interface and display or the decoder would be provided by such a computer. In other embodiments, the decoder could be built into a radio, hi-fi, tape player, TV, telephone or other piece of equipment capable of playing back an audio signal, and its displays and controls could be an integrated part of such an electronic system.

I claim:

1. A decoder for decoding digital information encoded onto an analog signal, comprising:

means for receiving said analog signal;

means for detecting said encoded digital information from said analog signal and generating decoded digital information therefrom, said decoded digital information identifying a product available for purchase;

means for storing said decoded digital information;

means for selecting digital information from said storing means representing a product desired to be purchased; and transmission means for transmitting said selected digital information to a predetermined vendor of said desired product.

2. The decoder of claim 1, wherein said analog signal is an audio signal representative of a musical selection, and said digital information includes information identifying said musical selection.

3. The decoder of claim 1, wherein said receiving means comprises an audio input terminal coupled to a source of said analog signal.

4. The decoder of claim 3, wherein said source is a tuner.

5. The decoder of claim 3, wherein said source is a receiver.

6. The decoder of claim 1, wherein said detecting means comprises a microcomputer.

7. The decoder of claim 1, wherein said storing means comprises a memory.

8. The decoder of claim 1, wherein said selecting means comprises a display for displaying information represented by said digital information, and a plurality of function buttons for selecting information to be displayed on said display and selecting displayed information to be transmitted by said transmission means.

9. The decoder of claim 1, wherein said transmission means comprises a modem.

10. A decoder for decoding digital information encoded onto an analog signal, comprising:

means for receiving said analog signal;

means for detecting said encoded digital information from said analog signal and generating decoded digital information therefrom, said decoded digital information identifying the content of said analog signal;

means for storing said decoded digital information;

means for selecting certain digital information from among digital information stored in said storing means; and transmission means for transmitting said selected digital information to an external storage medium.

11. The decoder of claim 10, wherein said analog signal is an audio signal representative of a musical selection, and said digital information includes information identifying said musical selection.

12. The decoder of claim 10, wherein said receiving means comprises an audio input terminal coupled to a source of said analog signal.

13. The decoder of claim 12, wherein said source is a tuner.

14. The decoder of claim 12, wherein said source is a receiver.

15. The decoder of claim 10, wherein said detecting means comprises a microcomputer.

16. The decoder of claim 10, wherein said storing means comprises a memory.

17. The decoder of claim 10, wherein said selecting means comprises a display for displaying information represented by said digital information, and a plurality of function buttons for selecting information to be displayed on said display and selecting displayed information to be transmitted by said transmission means.

18. The decoder of claim 10, wherein said transmission means comprises a modem.

19. The decoder of claim 11, wherein said external storage medium comprises a computer memory.

20. The decoder of claim 19, wherein said computer memory is accessed by a vendor of said musical selection.

* * * * *